US008051342B2

(12) United States Patent
Iioka

(10) Patent No.: US 8,051,342 B2
(45) Date of Patent: Nov. 1, 2011

(54) SEMICONDUCTOR MEMORY DEVICE

(75) Inventor: Osamu Iioka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 208 days.

(21) Appl. No.: 12/249,400

(22) Filed: Oct. 10, 2008

(65) Prior Publication Data

US 2009/0097322 A1    Apr. 16, 2009

(30) Foreign Application Priority Data

Oct. 16, 2007  (JP) .................................. 2007-268948

(51) Int. Cl.
*G11C 29/00* (2006.01)

(52) U.S. Cl. ............ 714/718; 714/25; 714/48; 714/719; 714/720; 714/733; 365/200; 365/201; 365/189.15; 365/210.1; 365/203; 365/230.03; 365/145

(58) Field of Classification Search ........................ None
See application file for complete search history.

(56) References Cited

U.S. PATENT DOCUMENTS

| | | | | | |
|---|---|---|---|---|---|
| 5,606,527 | A | * | 2/1997 | Kwack et al. ................. | 365/201 |
| 5,682,389 | A | * | 10/1997 | Nizaka .......................... | 714/718 |
| 6,480,432 | B1 | * | 11/2002 | Nakayama .................... | 365/201 |
| 6,754,094 | B2 | * | 6/2004 | McClure ....................... | 365/145 |
| 6,781,902 | B2 | * | 8/2004 | Oumiya et al. ............... | 365/201 |
| 7,440,347 | B1 | * | 10/2008 | Vogelsang .................... | 365/201 |
| 2003/0107920 | A1 | * | 6/2003 | Roohparvar ............. | 365/185.22 |
| 2008/0037336 | A1 | * | 2/2008 | Kouno ..................... | 365/189.15 |
| 2009/0257293 | A1 | * | 10/2009 | Kouno ..................... | 365/189.15 |

FOREIGN PATENT DOCUMENTS

| | | |
|---|---|---|
| JP | 07-192500 A | 7/1995 |
| JP | 2000-195300 A | 7/2000 |
| JP | 2000-285697 A | 10/2000 |
| JP | 2001-243121 A | 9/2001 |

* cited by examiner

*Primary Examiner* — John Trimmings
(74) *Attorney, Agent, or Firm* — Arent Fox LLP

(57) ABSTRACT

A semiconductor memory device including: a memory cell array including a plurality of word lines, a plurality of bit lines, and memory cells arranged in portions where the plurality of word lines and the plurality of bit lines intersect with each other; a plurality of data bus lines connected to the plurality of bit lines; a plurality of sense amplifiers individually connected to the plurality of data bus lines and configured for detecting memory data stored in corresponding memory cells based on values of currents that are generated in the individual data bus lines in accordance with the memory data.

16 Claims, 6 Drawing Sheets

Imc(Program,0) < Iref < Imc(Erase,1)

Vread(Program,0) > Vref > Vread(Erase,1)

FIG. 6

| TEST | ADD [15:0] (D [15:0]) | Dout [15:0] |
|---|---|---|
| 0 | ADDRESS | DATA |
| 1 | 0000h | FFFFh |
|  | 0001h | FFFEh |
|  | 0002h | FFFDh |
|  | 0004h | FFFBh |
|  | 0008h | FFF7h |
|  | 0010h | FFEFh |
|  | ⋮ | ⋮ |
|  | 4000h | BFFFh |
|  | 8000h | EFFFh |
|  | FFFFh | 0000h |
|  | FFFEh | 0001h |
|  | FFFDh | 0002h |
|  | FFFBh | 0004h |
|  | FFF7h | 0008h |
|  | FFEFh | 0010h |
|  | ⋮ | ⋮ |
|  | BFFFh | 4000h |
|  | EFFFh | 8000h |

US 8,051,342 B2

SEMICONDUCTOR MEMORY DEVICE

CROSS REFERENCES TO RELATED APPLICATIONS

This application is based upon and claims the benefit of priority from the prior Japanese Patent Application No. 2007-268948 filed on Oct. 16, 2007, the entire contents of which are incorporated herein by reference.

BACKGROUND

1. Field

The embodiments relate to semiconductor memory devices capable of detecting whether a short circuit has occurred between data bus lines.

2. Description of the Related Art

In a semiconductor memory device, a memory cell array and external input/output terminals or other internal logical circuits are connected to each other with a plurality of data bus lines therebetween. The memory cell array includes a plurality of word lines, a plurality of bit lines, and memory cells arranged in portions where the plurality of word lines and the plurality of bit lines intersect with each other. In accordance with the layout of components constituting a chip, that is, in the case where the wire lengths of the data bus lines are increased a short circuit failure caused by a manufacturing process may occur between adjacent data bus lines.

By writing a specific data pattern into memory cells and reading the specific data pattern in a performance test process, such a short circuit failure between data bus lines can be detected. The data pattern to be written is selected in such a manner that data items having different levels (that is, a data item at level HI and a data item at level L or a data item at level L and a data item at level H) are output to adjacent data bus lines.

However, in the case of carrying out the above-mentioned performance test, a process for writing data must be performed. In addition, after the performance test is carried out, a process for deleting data must be performed. In particular, since a memory device, such as a flash memory device, including an electrically erasable programmable read-only memory (EEPROM) serving as a memory cell, which requires a relatively long time to perform the writing process and the deleting process, the throughput of the performance test is reduced.

In order to solve the above-described problem, technology described in Japanese Patent Laid-Open No. 7-192500 is available. According to the technology, a test circuit for floating a word line or the like for which a short-circuit check is to be performed and for applying a reference voltage is provided.

In addition, technology described in Japanese Patent Laid-Open No. 2000-195300 is available. According to the technology, mask read-only memories (ROMs) are added to bit lines within a memory cell array and a data pattern of data items for short circuit testing is written to the mask ROMs. Thus, by selecting mask ROM memory cells and outputting a data pattern of data items for testing bit lines in a short circuit failure detection test process, a detection whether a short circuit failure has occurred between the data bus lines can be performed by outputting different data items to adjacent data bus lines and determining whether the data outputs are the same as the expected values.

SUMMARY

According to an aspect of an embodiment, a semiconductor memory device includes a memory cell array including a plurality of word lines, a plurality of bit lines, and memory cells arranged in portions where the plurality of word lines and the plurality of bit lines intersect with each other; a plurality of data bus lines connected to the plurality of bit lines; a plurality of sense amplifiers individually connected to the plurality of data bus lines and configured to detect memory data stored in corresponding memory cells based on values of currents that are generated in the individual data bus lines in accordance with the memory data; switching means provided in the individual data bus lines; and a test circuit configured to cause, in a normal operation, all the switching means to be in a conductive state and cause, in short circuit testing, the switching means to be in the conductive state or a non-conductive state in accordance with a test pattern.

BRIEF DESCRIPTION OF THE DRAWINGS

FIG. 6 is an illustration showing address signals and data outputs in the embodiment.

DESCRIPTION OF THE PREFERRED EMBODIMENTS

Embodiments will be described with reference to the drawings.

Figure 1:
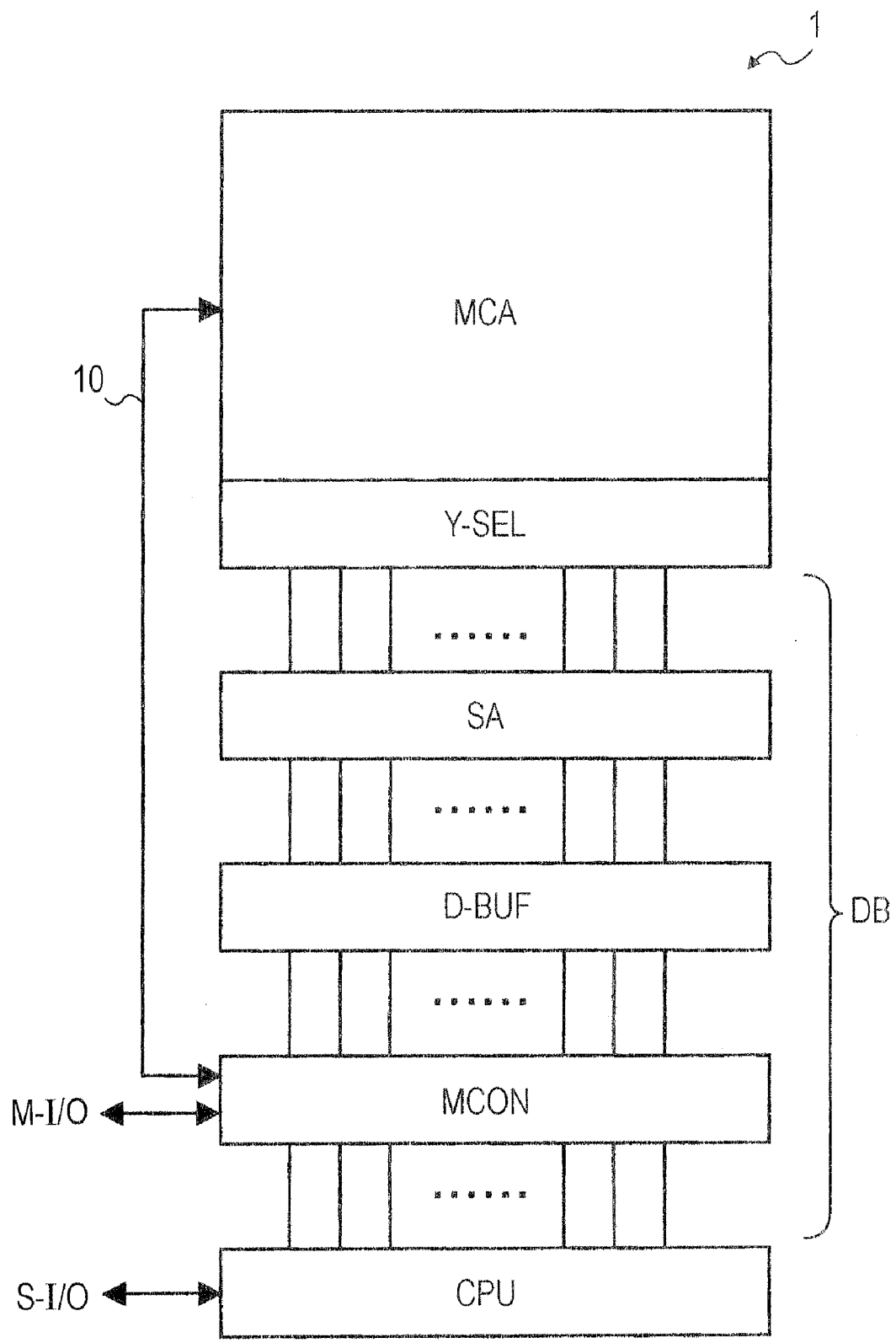
FIG. 1 shows an example of the configuration of a microprocessor including a semiconductor memory device according to an embodiment.

FIG. 1 shows an example of the configuration of a microprocessor including a semiconductor memory device according to an embodiment. A microprocessor 1 includes an arithmetic unit CPU, a memory controller MCON, and a memory unit. The memory unit includes a memory cell array MCA, a column selecting circuit Y-SEL, sense amplifiers SA, and a data buffer D-BUF. The memory cell array MCA includes a plurality of word lines, a plurality of bit lines, and a plurality of memory cells arranged in portions where the plurality of word lines and the plurality of bit lines intersect with each other. Bit lines selected by the column selecting circuit Y-SEL are connected to data bus lines DB via the column selecting circuit Y-SEL. Signals outputted to the data bus lines DB are amplified by the sense amplifiers SA, the amplified signals are subjected to buffering by the data buffer D-BUF, and the signals that have been subjected to buffering are outputted to the memory controller MCON. The memory controller MCON is located between the arithmetic unit CPU and the memory unit. In response to memory access from the arithmetic unit CPU, the memory controller MCON outputs an address and a control signal 10 for controlling the memory unit.

The memory controller MCON is connected to an external device via a memory input/output terminal M-I/O. In addition, the arithmetic unit CPU is connected to an external device via a system input/output terminal S-I/O.

In this embodiment, signal lines through which data signals propagate from the column selecting circuit Y-SEL to the arithmetic unit CPU are defined as data bus lines DE. The data bus lines DE, which are relatively long, are arranged within a semiconductor chip. The number of data bus lines DB correspond to the data bus width of the memory unit. Even in the case of a memory device not including an arithmetic unit CPU or a memory controller MCON, the lengths of the data bus lines DB may be long, depending on the arrangement of the memory device.

For the microprocessor 1 having the above-described configuration, short circuit testing for checking whether a short circuit has occurred between adjacent data bus lines DB is required.

Figure 2:
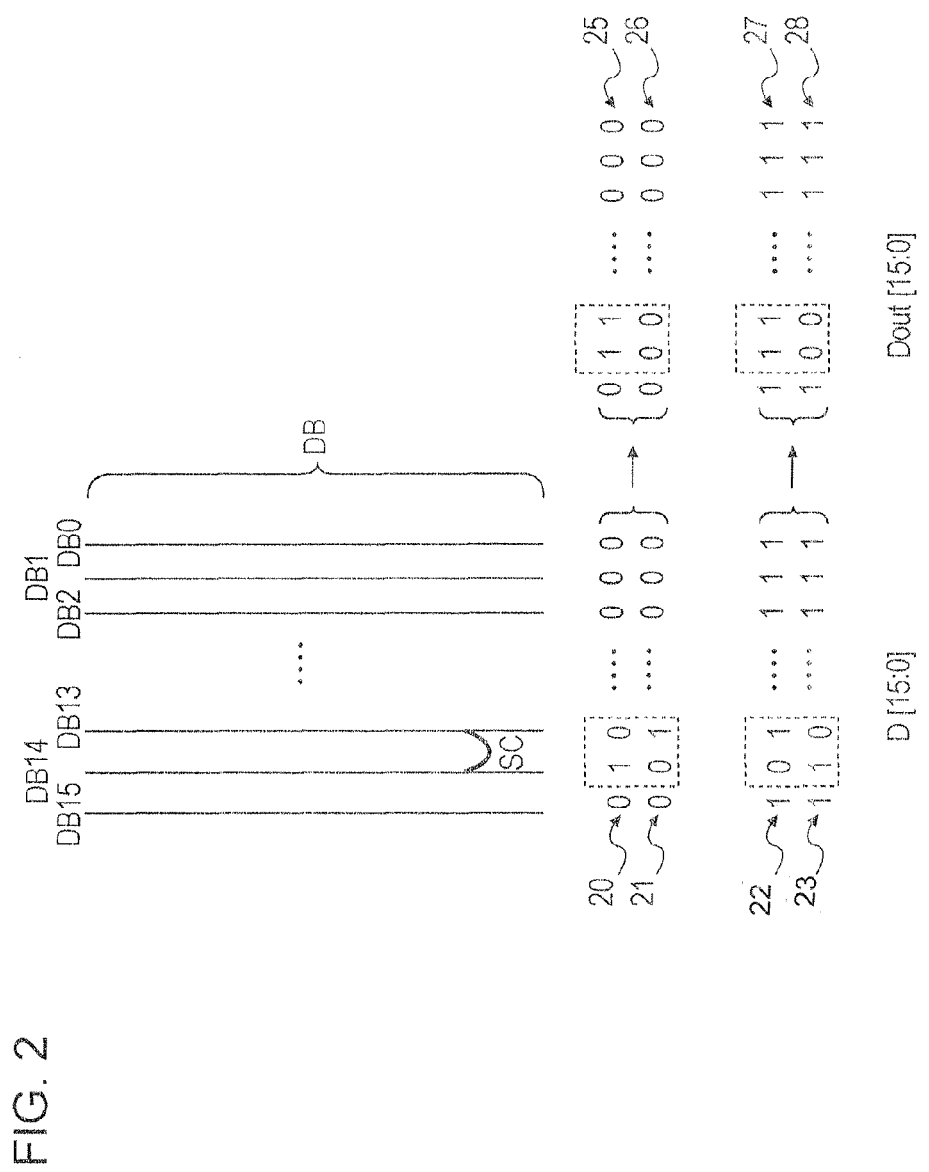
FIG. 2 is an illustration for explaining short circuit testing.

FIG. 2 is an illustration for explaining short circuit testing. Referring to FIG. 2, the data bus lines DB are represented as sixteen data bus lines DB0 to DB15. For example, it is assumed that a short circuit failure SC has occurred between the data bus lines DB13 and DB14. In order to perform detection of whether the short circuit failure SC has occurred, as a data pattern D[15:0] of data items, a data pattern 20, 21, 22, or 23 in which the data bus lines DB13 and DB14 exhibit "1" and "0", respectively, or the data bus lines DB13 and DB14 exhibit "0" and "1", respectively, can be reproduced. Each of the data patterns 20 and 21 are an example in which all the data bus lines other than the data bus lines DB13 and DB14 exhibit "0". Each of the data patterns 22 and 23 are an example in which all the data bus lines other than the data bus lines DB13 and DB 14 exhibit "1".

If output data Dout[15:0] for the data pattern 20 corresponds to an, output data pattern 25 or 26, it is determined that a short circuit failure has occurred between the data bus lines DB13 and DB14. Similarly, if output data Dout[15:0] for the data pattern 21 corresponds to the output data pattern 25 or 26, it is determined that a short circuit failure has occurred between the data bus lines DB13 and. DB14. On the other hand, if an output data pattern is the same as an expected data pattern, it is determined that a short circuit failure has not occurred.

If output data Dout[15:0] for the data pattern 22 corresponds to an output data pattern 27 or 28, it is determined that a short circuit failure has occurred between the data bus lines DB13 and DB14. Similarly, if output data Dout [15:0] for the data pattern 23 corresponds to the output data pattern 27 or 28, it is determined that a short circuit failure has occurred between the data bus lines DB13 and DB14.

Thus, in the short circuit testing, checking of output data Dout[15:0] outputs to the data bus line DB is performed. In the case that the data pattern of the output data is the same as an expected data pattern, it is determined that no short circuit failure has occurred. On the other hand, in the case that a different data pattern is obtained as the output data as described above, it is determined that a short circuit failure has occurred.

In order to perform the checking of whether a short circuit failure has occurred for each pair of data bus lines, sixteen types of data patterns in which only one data bus line exhibits "1" and the other data bus lines exhibit "0" and sixteen types of data patterns in which only one data bus line exhibits "0" and the other data bus lines exhibit "1" can be reproduced.

Figure 3:
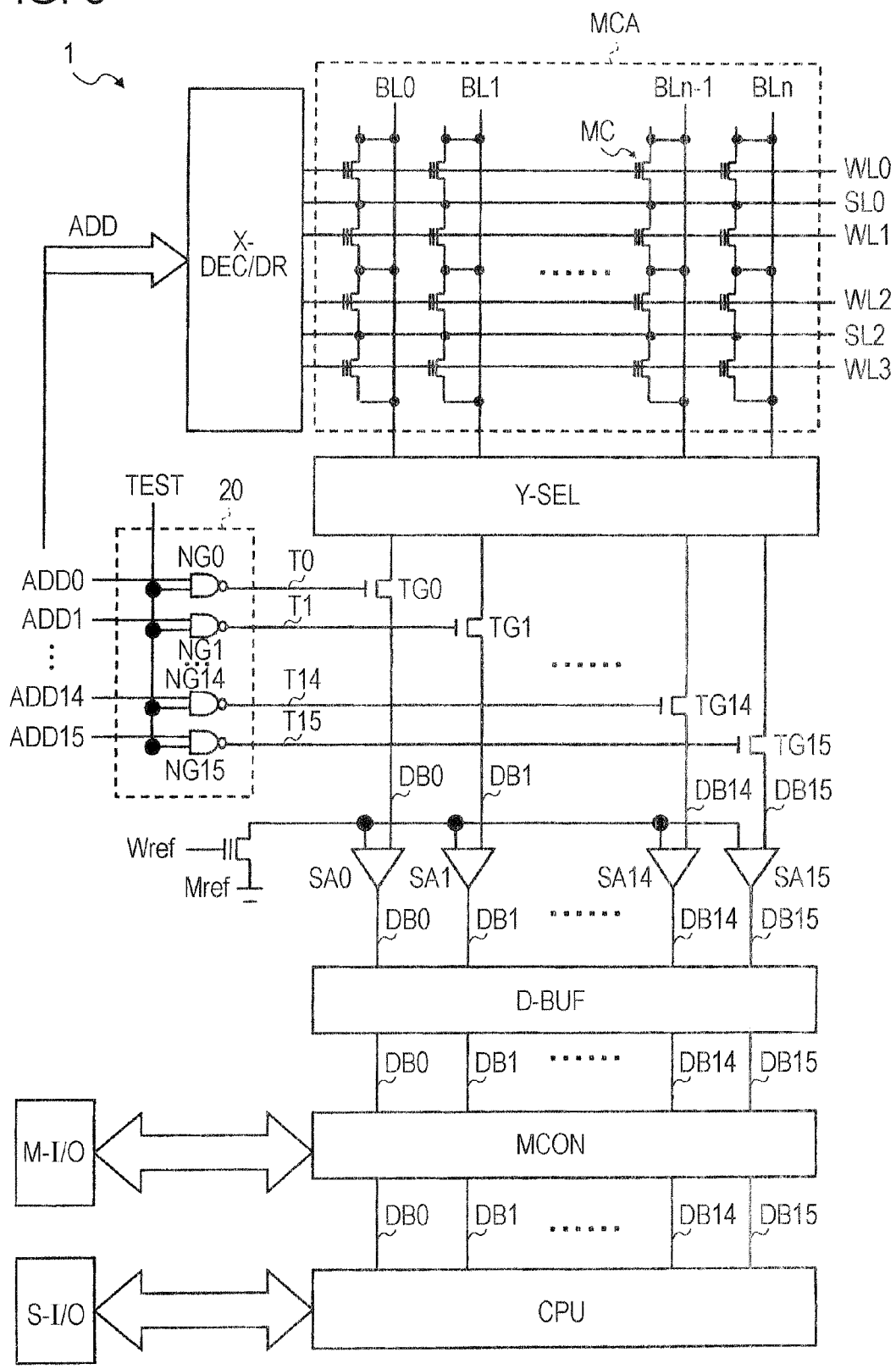
FIG. 3 shows an example of the configuration of the microprocessor including the semiconductor memory device according to the embodiment.

FIG. 3 shows an example of the configuration of the microprocessor 1 including a semiconductor memory device according to this embodiment. The internal configuration of the memory cell array MCA shown in FIG. 1 is shown in more detail in FIG. 3. The memory cell array MCA includes word lines WL0 to WL3, bit lines BL0 to BLn, memory cells MC arranged in portions where the word lines WL0 to WL3 and the bit lines BL0 to BLn intersect with each other and source lines SL0 and SL2 are connected to the memory cells MC. The memory cells MC each include an electrically rewritable cell transistor having a floating gate. The cell transistor has a threshold voltage corresponding to an electric charge injected into the floating gate. In a delete state in which no electrons are injected into the floating gates the cell transistor has a low threshold voltage. In a program state (or a write state) in which electrons are injected into the floating gate, the cell transistor has a high threshold voltage. However, the memory cells MC do not necessarily have the above-described configuration.

A row decoder/driver X-DEC/DR is provided for the memory cell array MCA. The row decoder/driver X-DEC/DR decodes a row address signal ADD and drives a selected word line WL. During a reading operation, a source line SL is connected to the ground or a predetermined low voltage. When the selected word line WL is driven, memory cells MC cause drain currents to flow to bit lines BL in accordance with threshold voltage states of the memory cells MC. If a memory cell MC is in the delete state, that is, a low threshold voltage state, a large drain current flows. On the other hand, if a memory cell MC is in the program state, that is, a high threshold voltage state, a small drain current flows.

In accordance with a column selecting signal from a column decoder (not shown), the column selecting circuit Y-SEL causes bit lines BL selected from among the plurality of bit lines EL to be connected to the data bus lines DB0 to DB15 via column switches Thus, during a reading operation, currents corresponding to data stored in corresponding memory cells MC flows to the data bus lines DB0 to DB15. The data bus lines DB0 to DB15 are connected to sense amplifiers SA0 to SA15. A reference drain current from a reference memory cell. Mref is supplied to each of the sense amplifiers SA0 to SA15. Thus, the sense amplifiers SA0 to SA15 detect data read from the data bus lines DB0 to DB15 on the basis of the reference drain current and the drain currents of the selected memory cells MC.

Outputs of the sense amplifiers SA0 to SA15 are connected to the data bus lines DB0 to DB15, and are supplied to the arithmetic unit CPU via the data buffer D-BUF and the memory controller MCON.

In the example shown in FIG. 3, transfer gate transistors TG0 to TG15, which are N-channel metal-oxide semiconductor (MOS) transistors, are provided as switching means in the data bus lines DB0 to DB15 connected to the inputs of the sense amplifiers SA0 to SA15. A test circuit 20 supplies switch control signals T0 to T15 to gates of the transfer gate transistors TG0 to TG15. The test circuit 20 receives a test control signal TEST from an external test device or an internal circuit such as the memory controller MCON. The test circuit 20 also receives a data pattern of data items for short circuit testing from address terminals ADD0 to ADD15.

The test circuit 20 includes NAND gates NG0 to NG15 corresponding to the transfer gate transistors TG0 to TG15. The NAND gates NG0 to NG15 receive a test control signal TEST and a data pattern of data items from the address terminals ADD0 to ADD15, and outputs switch control signals T0 to T15.

At the time of a normal operation, a test control signal TEST is set to level L, and the NAND gates NG0 to NG15 set all the switch control signals T0 to T15 to level H, irrespective of the level of a signal supplied to an address terminal. Thus, the transfer gate transistors TG0 to TG15 provided in the data bus lines DB0 to DB15 are set to a conductive state.

At the time of short circuit testing, the test control signal TEST is set to level H, and the NAND gates NG0 to NG15 set the switch control signals T0 to T15 to levels that are inversions of the levels of data pattern signals supplied to the address terminals ADD0 to ADD15. Thus, the transfer data transistors TG0 to TG15 provided in the data bus lines DB0 to DB15 are set to a conductive state or a non-conductive state in accordance with the corresponding data pattern signals.

Figure 4:
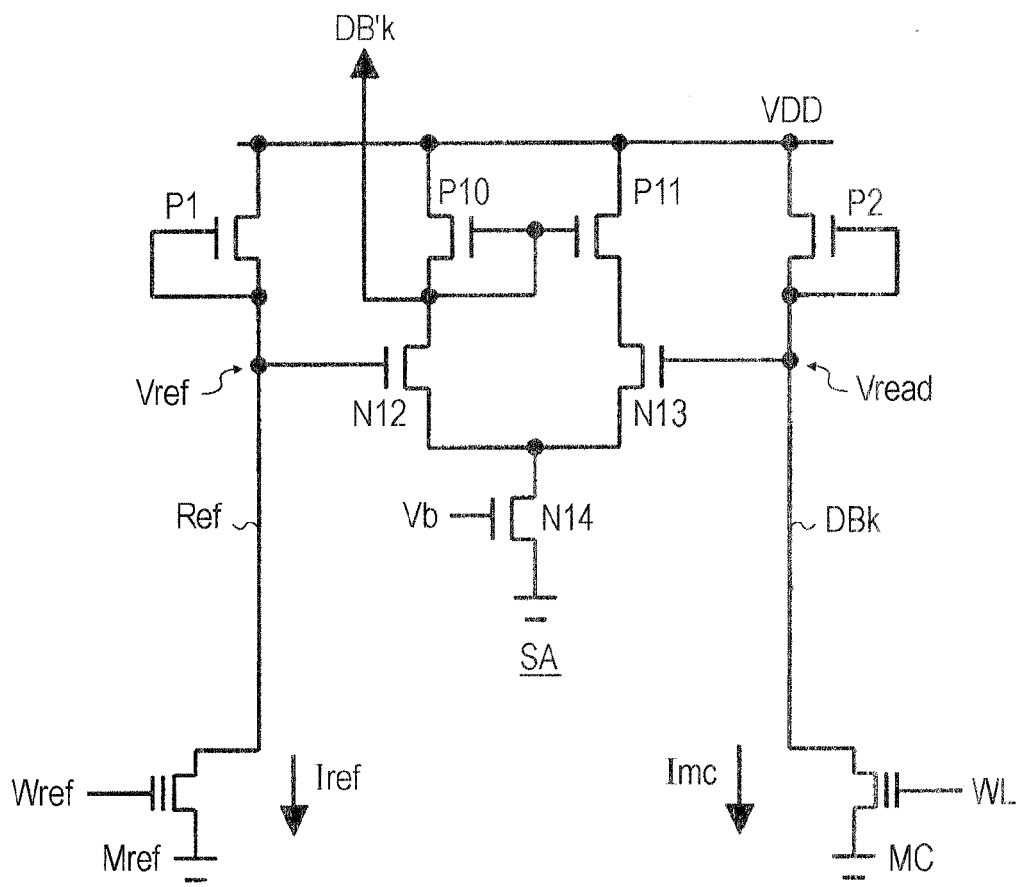
FIG. 4 shows an example of the configuration of a sense amplifier.

FIG. 4 shows an example of the configuration of a sense amplifier SA. The sense amplifier SA includes P-channel transistors P10 and P11, a differential circuit, and a load circuit. The differential circuit includes N-channel differential transistors N12, N13, and N14. The load circuit includes P-channel transistors P1 and P2. The P-channel transistor P1 is connected to a reference signal line Ref connected to a reference memory cell Mref. The P-channel transistor P2 is connected to a data bus line DBk connected to memory cell MC. A read voltage Vread of the data bus line DBk and a reference voltage Vref of the reference signal line Ref are supplied to the gates of the differential transistors N13 and N12, respectively. In addition, a certain bias voltage Vb is supplied to the gate of the differential transistor N14, and a certain current is generated in the differential transistor N14. In FIG. 4, a column switch in a column selecting circuit is omitted.

An operation of the sense amplifier SA in a normal operation state will be described with reference to FIG. 4. As described above, in the delete state (data 1) in which no electrons are injected into the floating gate of a memory cell MC, the memory cell MC exhibits a low threshold voltage. In this state, when a corresponding word line WL is selected and driven, a large drain current Imc is generated in the memory cell MC. In addition, in the program state or the write state (data 0) in which electrons are injected into the floating gate of a memory cell MC, the memory cell MC exhibits a high threshold voltage. In this state, when a corresponding word line WL, is selected and driven, a small drain current Imc is generated in the memory cell MC. The drain current Imc flows, through a corresponding bit line (not shown) and the column selecting circuit Y-SEL, to a corresponding data bus line DBk.

Meanwhile, the floating gate of the reference memory cell Mref is set to an intermediate state between the delete state and the program state of the memory cells MC. In addition, the amount of electrons injected into the floating gate of the reference memory cell. Mref is smaller than the amount of electrons injected into the floating gate of the memory cell MC in the program state. Thus, the threshold voltage of the reference memory cell Mref is higher than the threshold voltage of the memory cell MC in the delete state and lower than the threshold voltage of the memory cell MC in the program state. During the read operation, the reference memory cell Mref is driven so that the potential of the gate Wref of the reference memory cell Mref reaches the same potential as that of the word line WL, and a reference current Iref is generated as a drain current of the reference memory cell Mref. That is, as shown in FIG. 4, the relationship between the reference current Iref and the drain current Imc of the memory cell MC can be represented by the expression:

$$Imc(\text{Program}, 0) < Iref < Imc (\text{Erase}, 1).$$

Due to such a difference between the drain currents, the sense amplifier SA obtains the relationship between the read voltage Vread of the data bus line DBk and the reference voltage Vref of the reference signal line Ref as follows:

$$Vread(\text{Program}, 0) > Vref > Vread (\text{Erase}, 1).$$

The sense amplifier SA detects this voltage relationship, and outputs a read signal to a subsequent data bus line DB'k. In the example shown in FIG. 4, the phase of the potential of the output data bus line DB'k is the same as the phase of the potential of the input data bus line DEk. However, the drain terminal of the differential transistor N13 may be connected to the output data bus line DB'k so that the phase of the potential of the output data bus line DB'k is opposite the phase of the potential of the input data bus line DBk.

Figure 5:
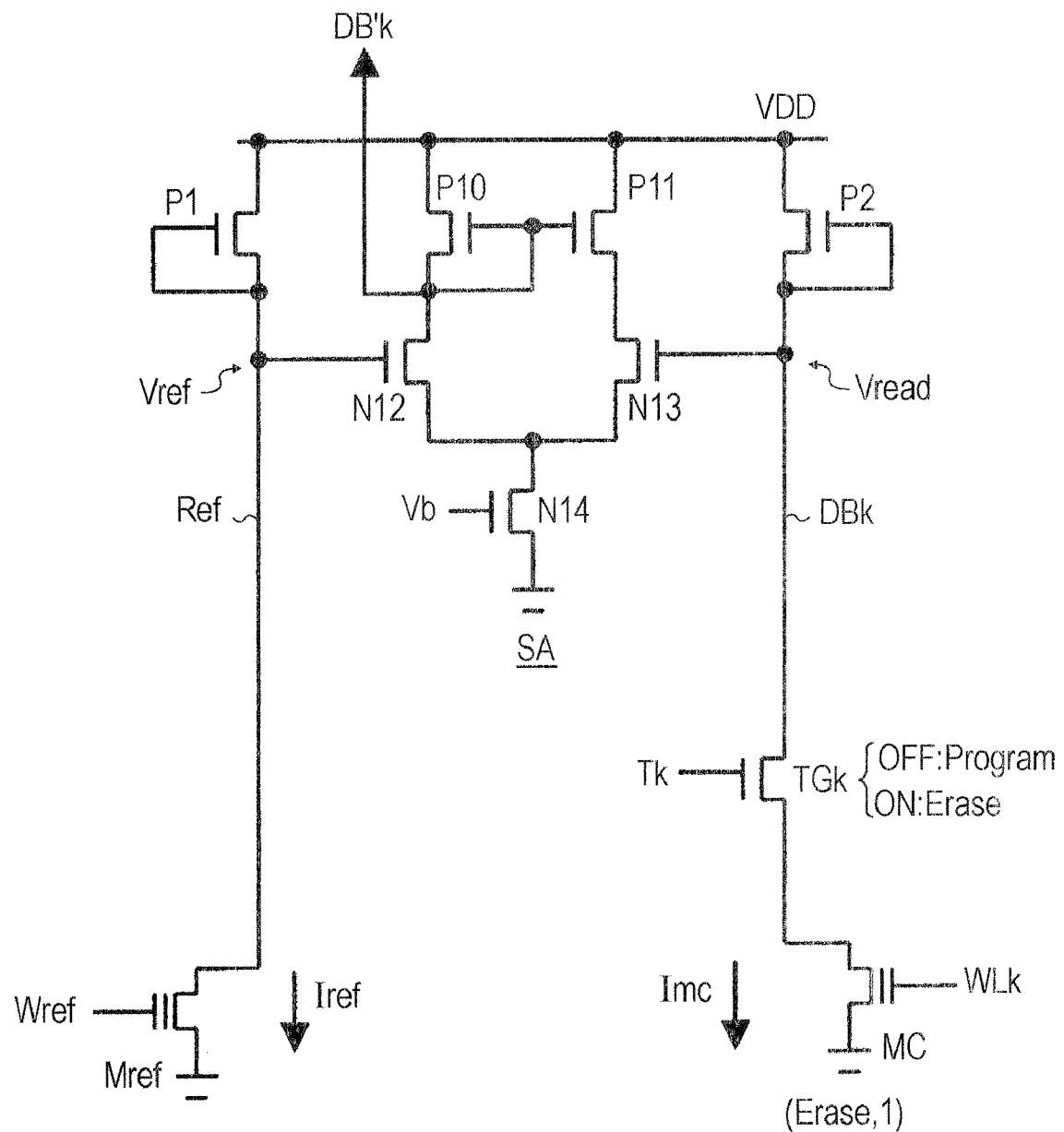
FIG. 5 shows an example of the configuration of a sense amplifier including switching means according to the embodiment.

FIG. 5 shows an example of the configuration of each of the sense amplifiers SA including switching means according to this embodiment. Referring to FIG. 5, a transfer gate transistor TGk, which serves as a switching means, is provided in a data bus line DBk. The other features of the configuration of the sense amplifier SA are the same as in FIG. 4.

In this embodiment, at the time of short circuit testing, each of the memory cells MC in the memory cell array MCA is set to the initial state, that is, the delete state. Thus, during a read operation in the short circuit testing, the memory cell MC generates a drain current Imc that is larger than the reference current Iref. In the short circuit testing, a switch control signal Tk is set to level H or level L in accordance with a data pattern received at a corresponding address terminal. Then, the transfer transistor TGk is set to the conductive state or the non-conductive state.

When the transfer gate transistor TGk is set to the conductive state (ON), a large drain current Imc of the memory cell MC flows to the data bus line DBk. Thus, the same state as the delete state shown in FIG. 4 is achieved. On the other hand, when the transfer gate transistor TGk is set to the non-conductive (OFF), a drain current Imc of the memory cell MC does not flow to the data bus line DBk. Thus, the read voltage Vread of the data bus line DBk is set to level H by the P-channel transistor P2, and the relationship Vread>Vref is achieved. Thus, substantially the same state as the program state shown in FIG. 4 can be achieved.

As described above, the transfer gate transistor TGk serving as switching means is provided in the data bus line DBk connected to an input terminal of the sense amplifier SA, and the transfer gate transistor TGk is set to the conductive state or the non-conductive state in accordance with a switch control signal Tk supplied from the test circuit 20. Thus, the sense amplifier SA can be set to the same state as the delete state or the program state of the memory cell MC. As a result, a voltage state corresponding to one of the data patterns shown in FIG. 2 can be outputted from the sense amplifier SA to the subsequent data bus line DB'k.

According to this embodiment, since the data bus lines DB0 to DB15 are connected to bit lines that are selected from among the plurality of bit lines by the column selecting circuit Y-SEL, the number of data bus lines DB is smaller than the number of bit lines BL. Thus, even if the transfer gate transistors TG0 to TG15 are provided in the data bus lines DB, an increase in the circuit size can be minimized. In addition, since short circuit testing is performed for the memory cells MC in the initial state, the delete state, in the memory cell array MCA, the semiconductor memory device can be immediately shipped after the short circuit testing. Thus, the throughput of the testing process can be increased.

FIG. 6 is an illustration showing address signals and data outputs in this embodiment. In a normal operation, a test control signal TEST is set to level L, which is indicated by "0". The NAND gates NG0 to NG15 of the test circuit 20 set all the switch control signals T0 to T15 to level H, and all the transfer gate transistors TG0 to TG15 are set to the conductive state. Thus, the output data Dout[15:0] corresponds to the delete state or the program state of memory cells MC. In addition, during the normal operation, desired addresses are inputted to the address terminals ADD[15:0].

Meanwhile, in short circuit testing, the test control signal TEST is set to level H, which is indicated by "1". A data pattern D[15:0] of data items for short circuit testing is inputted to the address terminals ADD[15:0]. In FIG. 6, hexadecimal 16-bit data patterns are shown. That is, data patterns D[15:0] to be supplied via the address terminals ADD[15:0] are grouped into patterns (0000h to 8000h) in which only one bit indicates "1" and the other fifteen bits indicate "0" and patterns (FFFFh to EFFFh) in which only one bit indicates "0" and the other fifteen bits indicate "1".

A data pattern D[15:0] of data items supplied to the address terminals ADD[15:0] is inverted by the NAND gates NG0 to NG15 in the test circuit 20. The transfer gate transistors TG0 to TG15 are set to "ON, Erase, data 1" or "OFF, Program, data 0" in accordance with "1" or "0" of the inverted switch control signals T0 to T15. Thus, in the case that a short circuit failure has not occurred, output data D[15:0] is the same as inverted data of a data pattern. D[15:0] of data items supplied from the address terminals ADD[15:0]. The output data Dout[15:0] shown in FIG. 6 is data obtained by inverting the data patterns D[15:0] On the other hand, in the case that a short circuit failure has occurred, data different from the expected data represented as the output data Dout[15:0] shown in FIG. 6 is output.

Since a data pattern D[15:0] of data items is supplied to the address terminals ADD[15:0], word lines or bit lines corresponding to the data pattern are selected in the memory cell array MCA. However, all the memory cells MC in the memory cell array MCA are set in the delete state. Thus, a drain current corresponding to the delete state flows to a data bus line DBk, irrespective of which word line or which bit line is selected. Thus, the operation shown in FIG. 5 can be performed.

As described above, according to this embodiment, switching means is provided in each data bus line and a test circuit for controlling the switching means is provided. Thus, short circuit testing for data bus lines can be performed.

The test circuit 20 shown in FIG. 3 may include, instead of the NAND gates, NOR gates and inventors for inverting outputs of the NOR gates. With this configuration, in a normal operation, a test control signal TEST is set to level H. Thus, all the outputs of the NOR gates are set to level L and all the outputs of the inventors are set to level H. In addition, during the short circuit testing, the test control signal TEST is set to level L. Thus, the transfer gates are set to the non-conductive state in accordance with a data pattern of data items supplied to the address terminals ADD[15:0].

In the above-described embodiment, the transfer gate transistors TG serving as switching means are N-channel MOS transistors. However, the transfer gate transistors TG may be CMOS transfer transistors in which N-channel transistors and P-channel transistors are connected in parallel with each other. Alternatively, the switching means may be circuit elements of any other type as long as the circuit elements can be set to the conductive state or the non-conductive state in accordance with a data pattern.

In the above-described embodiment, each of the memory cells MC includes a cell transistor having a floating gate. This embodiment may also be applied to a memory device including a detection circuit for detecting, in a reading operation, the potentials of bit lines and generating different currents in data bus lines in accordance with data stored in memory cells even in a case where the memory cells are dynamic random access memory (DRAM) memory cells or ferroelectric random-access memory (FeRAM) memory cells. That is, in FIG. 5, in a case where a detection circuit is provided between a memory cell MC and a transfer gate transistor TGk and the detection circuit supplies different currents to the data bus lines DB, short circuit testing with the use of the transfer gate transistor TGk can be achieved.

Although an example in which the microprocessor 1 including the memory unit and the arithmetic unit CPU has been described in the above-described embodiment, this embodiment can also be applied to a memory device including only a memory unit, and detecting whether a short circuit failure has occurred between data bus lines in such a memory device can be performed.

Although the embodiments of the present inventions have been described in detail, it should be understood that the various changes, substitutions, and alterations could be made hereto without departing from the spirit and scope of the invention.

What is claimed is:

1. A semiconductor memory device comprising:
a memory cell array including a plurality of word lines, a plurality of bit lines, and memory cells arranged in portions wherein the plurality of word lines and the plurality of bit lines intersect with each other;
a plurality of data bus lines connected to the plurality of bit lines;
a plurality of sense amplifiers individually connected to the plurality of data bus lines and configured for detecting memory data stored in corresponding memory cells based on values of currents that are generated in the individual data bus lines in accordance with the memory data, wherein each of the plurality of data bus lines is connected between one of the plurality of bit lines and one of the plurality of sense amplifiers, and wherein the plurality of data bus lines, the plurality of bit lines and the plurality of sense amplifiers are connected such that there is an equal number of each of the plurality of data bus lines, the plurality of bit lines and the plurality of sense amplifiers;
switching means provided in the individual data bus lines; and
a test circuit having a normal operation state wherein, all the switching means are in a conductive state and having a testing state wherein, in short circuit testing, the switching means are in the conductive state or a non-conductive state in accordance with a test pattern.

2. The semiconductor memory device according to claim 1, wherein the switching means each include a transfer gate transistor, and
wherein the test circuit supplies switch control signals to gates of the individual transfer gate transistors.

3. The semiconductor memory device according to claim 2, wherein when a test control signal indicates the normal operation state, the test circuit outputs the switch control signals for causing all the switching means to be in the conductive state, and
wherein when the test control signal indicates a short circuit testing state, the test circuit outputs the switch control signals for causing the switching means to be in the conductive state or the non-conductive state in accordance with the test pattern.

4. The semiconductor memory device according to claim 3, wherein the test pattern is supplied from address terminals to the test circuit.

5. The semiconductor memory device according to claim 4, wherein when first memory data is stored in one of the memory cells in the memory cell array, a current having a first value is generated in a corresponding one of the plurality of data bus lines,
wherein when second memory data, which is an inversion of the first memory data, is stored in the memory cell, a current having a second value, which is smaller than the first value, is generated in the data bus line, and wherein during the short circuit testing, the first memory data is stored in all the memory cells.

6. The semiconductor memory device according to claim 2, further comprising a reference memory cell, wherein during a read operation, the memory cells output, to the plurality of bit lines, currents having different values in accordance with the memory data stored in the individual memory cells, wherein during the read operation, the reference memory cell supplies the reference current, which has an intermediate value between a bit-line current when first memory data is stored in the memory cells and a bit-line current when second memory data, which is an inversion of the first memory data, is stored in the memory cells, and wherein each of the sense amplifiers compares a corresponding bit-line current with the reference current.

7. The semiconductor memory device according to claim 6, wherein the memory cells each include an electrically rewritable cell transistor having a floating gate.

8. The semiconductor memory device according to claim 2, wherein during the short circuit testing, in accordance with the test pattern, each transfer gate transistor corresponding to one of adjacent data bus lines of the plurality of data bus lines is set to the conductive state and a transfer gate transistor corresponding to the other one of the adjacent data bus lines of the plurality of data bus lines is set to the non-conductive state.

9. The semiconductor memory device according to claim 1, wherein when a test control signal indicates the normal operation state, the test circuit outputs switch control signals for causing all the switching means to be in the conductive state, and wherein when the test control signal indicates a short circuit testing state, the test circuit outputs switch control signals for causing the switching means to be in the conductive state or the non-conductive state in accordance with the test pattern.

10. The semiconductor memory device according to claim 9, wherein the test pattern is supplied from address terminals to the test circuit.

11. The semiconductor memory device according to claim 10, wherein when first memory data is stored in one of the memory cells in the memory cell array, a current having a first value is generated in a corresponding one of the plurality of data bus lines, wherein when second memory data, which is an inversion of the first memory data, is stored in the memory cell, a current having a second value, which is smaller than the first value, is generated in the data bus line, and wherein during the short circuit testing, the first memory data is stored in all the memory cells.

12. The semiconductor memory device according to claim 1, further comprising a reference memory cell, wherein during a read operation, the memory cells output, to the plurality of bit lines, currents having different values in accordance with the memory data stored in the individual memory cells, wherein during the read operation, the reference memory cell supplies the reference current, which has an intermediate value between a bit-line current when first memory data is stored in the memory cells and a bit-line current when second memory data, which is an inversion of the first memory data, is stored in the memory cells, and wherein each of the sense amplifiers compares a corresponding bit-line current with the reference current.

13. The semiconductor memory device according to claim 12, wherein the memory cells each include an electrically rewritable cell transistor having a floating gate.

14. A processor comprising:
a semiconductor memory device; and
an arithmetic unit,
wherein the semiconductor memory device includes
a memory cell array including a plurality of word lines, a plurality of bit lines, and memory cells arranged in portions where the plurality of word lines and the plurality of bit lines intersect with each other,
a plurality of data bus lines connected to the plurality of bit lines,
a plurality of sense amplifiers individually connected to the plurality of data bus lines and configured to detect memory data stored in corresponding memory cells based on values of currents that are generated in the individual data bus lines in accordance with the memory data, wherein each of the plurality of data bus lines is connected between one of the plurality of bit lines and one of the plurality of sense amplifiers, and wherein the plurality of data bus lines, the plurality of bit lines and the plurality of sense amplifiers are connected such that there is an equal number of each of the plurality of data bus lines, the plurality of bit lines and the plurality of sense amplifiers,
a switching means in each of the data bus lines, each switching means including a transfer gate transistor, and
a test circuit configured for causing, in a normal operation, all the switching means to be in a conductive state and for causing, in short circuit testing, the switching means to be in the conductive state or a non-conductive state in accordance with, a test pattern, the test circuit supplying switch control signals to gates of the individual transfer gate transistors, and
wherein the arithmetic unit is connected to the semiconductor memory device via the plurality of data bus lines.

15. The semiconductor memory device according to claim 1, further comprising a column selecting circuit coupling to the bit lines and the data bus lines.

16. The semiconductor memory device according to claim 14, further comprising a column selecting circuit coupling to the bit lines and the data bus lines.

* * * * *